United States Patent
Kon

(10) Patent No.: US 8,870,411 B2
(45) Date of Patent: Oct. 28, 2014

(54) LIGHTING APPARATUS AND LIGHTING UNIT

(75) Inventor: Tomoya Kon, Higashiomi (JP)

(73) Assignee: Kyocera Corporation, Kyoto (JP)

(*) Notice: Subject to any disclaimer, the term of this patent is extended or adjusted under 35 U.S.C. 154(b) by 1431 days.

(21) Appl. No.: 12/593,584

(22) PCT Filed: Mar. 28, 2008

(86) PCT No.: PCT/JP2008/056084
§ 371 (c)(1),
(2), (4) Date: Feb. 12, 2013

(87) PCT Pub. No.: WO2008/117865
PCT Pub. Date: Oct. 2, 2008

(65) Prior Publication Data
US 2013/0201684 A1    Aug. 8, 2013

(30) Foreign Application Priority Data

Mar. 28, 2007 (JP) .................................. 2007-083937
May 30, 2007 (JP) .................................. 2007-143960

(51) Int. Cl.
| F21V 7/00 | (2006.01) |
| F21K 99/00 | (2010.01) |
| F21V 7/09 | (2006.01) |
| F21V 7/06 | (2006.01) |
| F21V 5/04 | (2006.01) |
| H01L 33/60 | (2010.01) |
| F21Y 101/02 | (2006.01) |
| F21S 2/00 | (2006.01) |

(52) U.S. Cl.
CPC ... *F21V 7/06* (2013.01); *F21V 5/04* (2013.01); *F21K 9/00* (2013.01); *F21V 7/0083* (2013.01); *H01L 33/60* (2013.01); *F21Y 2101/02* (2013.01); *F21V 7/0091* (2013.01); *F21V 7/09* (2013.01); *F21S 2/005* (2013.01)
USPC .. 362/247; 362/241; 362/249.02; 362/296.01

(58) Field of Classification Search
USPC .......... 362/247, 241, 249.02, 296.01, 296.05, 362/311.02, 249.03, 249.07
See application file for complete search history.

(56) References Cited

U.S. PATENT DOCUMENTS 6,443,594 B1    9/2002  Marshall et al. ............... 362/244
6,527,411 B1 *  3/2003  Sayers .......................... 362/245

(Continued)

FOREIGN PATENT DOCUMENTS

| JP | 2003-529792 | 10/2003 |
| JP | 2005-340184 | 12/2005 |
| JP | 3787148 | 3/2006 |
| JP | 2006-156074 | 6/2006 |

(Continued)

*Primary Examiner* — Evan Dzierzynski
(74) *Attorney, Agent, or Firm* — DLA Piper LLP (US)

(57) ABSTRACT

The present invention relates to improvement of light emitting property of a lighting apparatus having a plurality of light sources. The light emitting apparatus comprises a plurality of reflection unit (100u) and a plurality of light sources (13). Each of the plurality of reflection unit (100u) includes a first reflection surface (12a) and a plurality of second reflection surfaces (12b). Each of the plurality of second reflection surfaces (12b) is arranged around the first reflection surface (12a) and has a shape different from that of the first reflection surface (12a). Each of the plurality of light sources (13) includes a light emitting element made of a semiconductor material. The plurality of light sources (13) are arranged within the first reflection surface (12a) and the second reflection surfaces (12b).

14 Claims, 5 Drawing Sheets

(56) References Cited

U.S. PATENT DOCUMENTS

| | | | |
|---|---|---|---|
| 6,814,470 B2 * | 11/2004 | Rizkin et al. | 362/327 |
| 7,045,828 B2 | 5/2006 | Shimizu et al. | 257/98 |
| 2005/0242362 A1 | 11/2005 | Shimizu et al. | 257/99 |
| 2008/0002413 A1 * | 1/2008 | Wang et al. | 362/341 |

FOREIGN PATENT DOCUMENTS

| | | |
|---|---|---|
| JP | 2007-059371 | 3/2007 |
| JP | 2007-059930 | 3/2007 |
| JP | 4018744 | 9/2007 |

* cited by examiner

LIGHTING APPARATUS AND LIGHTING UNIT

TECHNICAL FIELD

The present invention relates to a lighting apparatus and a lighting unit having light emitting elements, for example, light emitting diodes.

BACKGROUND ART

Recently, lighting apparatuses using light emitting elements such as light emitting diodes have been in development. Lighting apparatuses using such light emitting elements are advantageous in terms of lowering power consumption and prolonging operating life, and thus, are expected to be used widely in place of conventional lighting apparatuses. As a related art, JP-A 2007-59930 is found.

A conventional lighting apparatus typically has a single light source. Light generated by the single light source is reflected onto a predetermined area by a reflector or the like. However, in the lighting apparatus using the light emitting element, currently in development, a plurality of light sources are used, and it is necessary to lead light generated by the plurality of light sources to a predetermined area. Therefore, with respect to the lighting apparatuses using light emitting elements, which are expected to be widely used, it is necessary to solve technical problems that have not been considered regarding the conventional lighting apparatuses.

DISCLOSURE OF THE INVENTION

In one aspect of the invention, a lighting apparatus comprises a plurality of reflection units and a plurality of light sources. Each of the plurality of reflection units includes a first reflection surface and a plurality of second reflection surfaces. Each of the plurality of second reflection surfaces is arranged around the first reflection surface, and has a shape different from that of the first reflection surface. The plurality of light sources are arranged within the first reflection surface and the second reflection surfaces, and each of the plurality of light sources includes a light emitting element made of a semiconductor material.

In another aspect of the invention, a lighting apparatus comprises a plurality of reflection units and a plurality of light sources. Each of the plurality of reflection units includes a plurality of reflection surfaces defining a reflection axis, and is capable of varying a direction of the reflection axis. The plurality of light sources are arranged within the plurality of reflection surfaces, and each of the plurality of light sources includes a light emitting element made of a semiconductor material.

In still another aspect of the invention, a lighting unit comprises a base and a plurality of light emitting elements. The lighting unit further comprises a first reflection surface and a second reflection surface. The plurality of light emitting elements are made of a semiconductor material and arranged in a plane on the base. The first reflection surface surrounds a light emitting element that is located in a central region of the base among the plurality of light emitting elements. The second reflection surface has a shape of non-rotational symmetry, and surrounds a light emitting element that is located in a peripheral region of the base among the plurality of light emitting elements.

According to the above-mentioned one aspect of the invention, the lighting apparatus comprises the second reflection surfaces arranged around the first reflection surface and having a shape different from that of the first reflection surface. The lighting apparatus is improved in light emitting property, due to the configuration.

According to the above-mentioned another aspect of the invention, the lighting apparatus comprises the plurality of reflection units each of which includes the plurality of reflection surfaces defining a reflection axis, and is capable of varying the direction of the reflection axis. The lighting apparatus is improved in light emitting property, due to the configuration.

According to the above-mentioned still another aspect of the invention, the lighting unit has a shape of non-rotational symmetry and comprises the second reflection surface surrounding a light emitting element that is located in the peripheral region of the base among the plurality of light emitting elements. The lighting unit is improved in light emitting property, due to the configuration.

BRIEF DESCRIPTION OF THE DRAWINGS

Other and further objects, features, and advantages of the invention will be more explicit from the following detailed description taken with reference to the drawings wherein:

FIG. 6 shows a planar view of the first reflection surface 12a;

FIG. 7 shows a distribution of light 12LD at the first reflection surface 12a;

BEST MODE FOR CARRYING OUT THE INVENTION

Figure 1:
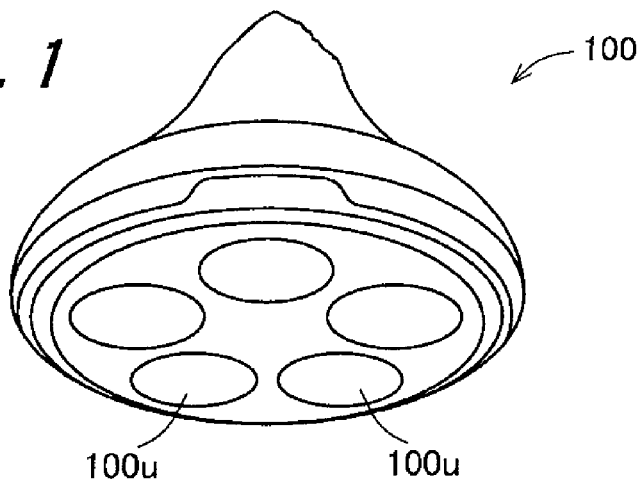
FIG. 1 shows a lighting apparatus 100 according to an embodiment of the invention.
Figure 2:
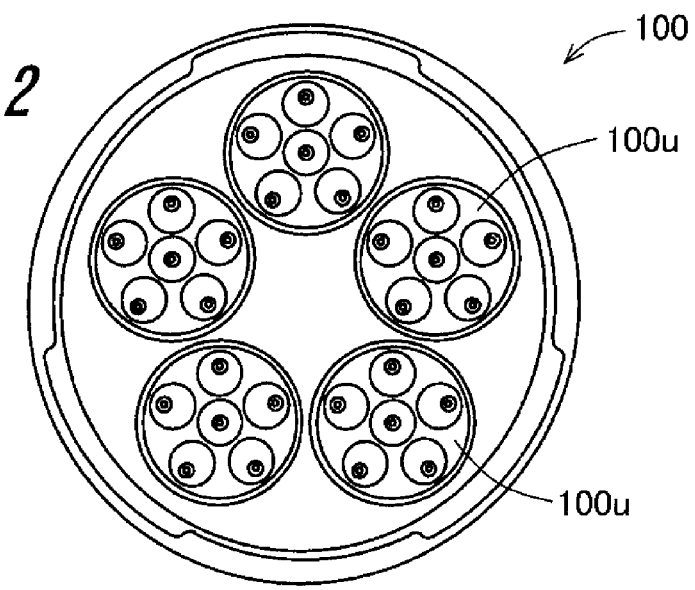
FIG. 2 shows the lighting apparatus 100.
Figure 3:
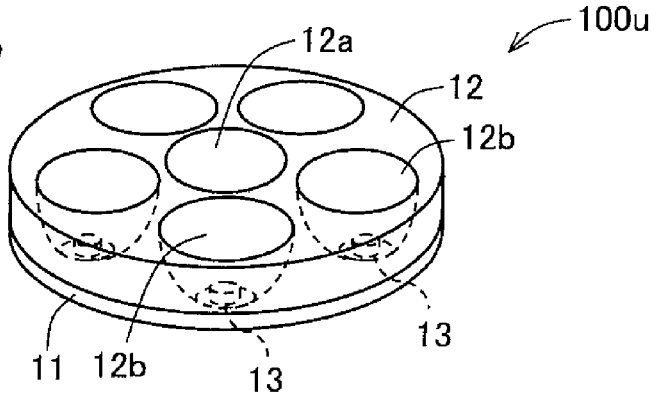
FIG. 3 shows a lighting unit 100u of the lighting apparatus 100.

Hereafter, an embodiment of the invention will be described with reference to the drawings. As shown in FIGS. 1 and 2, a lighting apparatus 100 comprises a plurality of lighting units 100u. The plurality of lighting units 100u are arranged two-dimensionally. As shown in FIG. 3, each of the plurality of lighting units 100u comprises a base 11, a reflection unit 12 and a plurality of light sources 13. The base 11 is made of an insulating material.

The reflection unit 12 is provided on the base 11 and is made of a metal material. The reflection unit 12 has a plurality of reflection surfaces 12a and 12b. The plurality of reflection surfaces 12a and 12b are arranged two-dimensionally. In other words, the plurality of reflection surfaces 12a and 12b are arranged in a plane.

Figure 4:
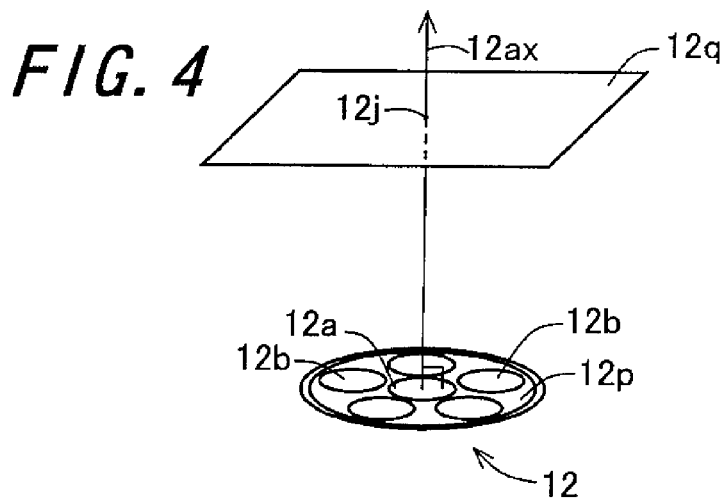
FIG. 4 shows a reflection axis 12ax of a reflection unit 12.

As shown in FIG. 4, a reflection axis 12ax is defined by the plurality of reflection surfaces 12a and 12b. The reflection axis 12ax means a line connecting a point 12j and an imaginary plane 12p on which the plurality of reflection surfaces 12a and 12b are arranged, at the point 12j light intensity being highest in an imaginary plane 12*q* that is away from the plane 12*p* by a predetermined distance (e.g. 50 cm). Defining the reflection axis 12*ax* means that a position and a direction of the reflection axis 12*ax* are determined by the plurality of reflection surfaces 12*a* and 12*b*. More specifically, the position and the direction of the reflection axis 12*ax* are determined by an arrangement of the plurality of reflection surfaces 12*a* and 12*b* and each of their shapes.

Figure 5:
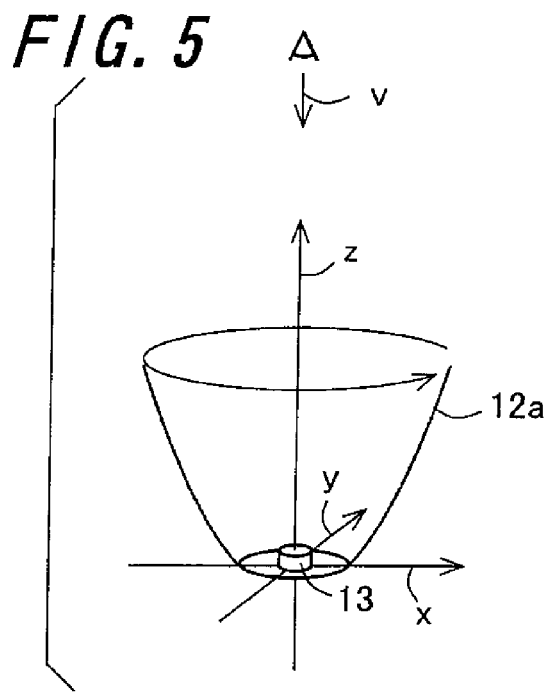
FIG. 5 shows a first reflection surface 12a of the reflection unit 12.

The plurality of reflection surfaces include a first reflection surface 12*a* and a plurality of second reflection surfaces 12*b*. As shown in FIG. 5, the first reflection surface 12*a* has a shape of axial rotational symmetry which results from rotating a curved line around a z-axis in an imaginary xyz-coordinate. A shape of axial rotational symmetry means a shape that does not cause any difference, when the shape is rotated around an axis in an imaginary coordinate, between before and after the rotation. The first reflection surface 12*a* has a shape of a portion of paraboloidal surface resulted from a rotation of a parabolic curve around the z-axis in the imaginary xyz-coordinate.

Figure 6:
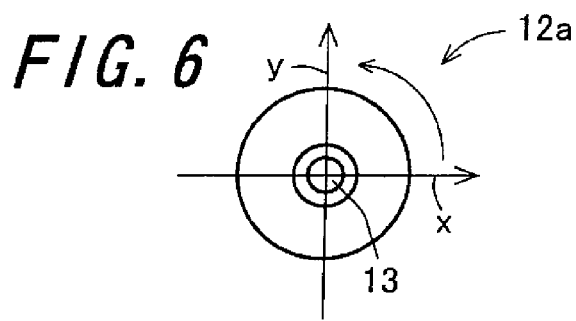

As shown in FIG. 6, the first reflection surface 12*a* has a shape of rotational symmetry in a planar view. The planar view means a visual field provided by the line of sight indicated with the reference symbol "v" in FIG. 5. The shape of rotational symmetry means a shape that does not cause any difference, when the shape is rotated around an origin of xy-coordinate in an imaginary xy-coordinate, between before and after the rotation. The first reflection surface 12*a* has a circular shape in a planar view. The light source 13 is arranged at the origin of the imaginary xy-coordinate.

Figure 7:
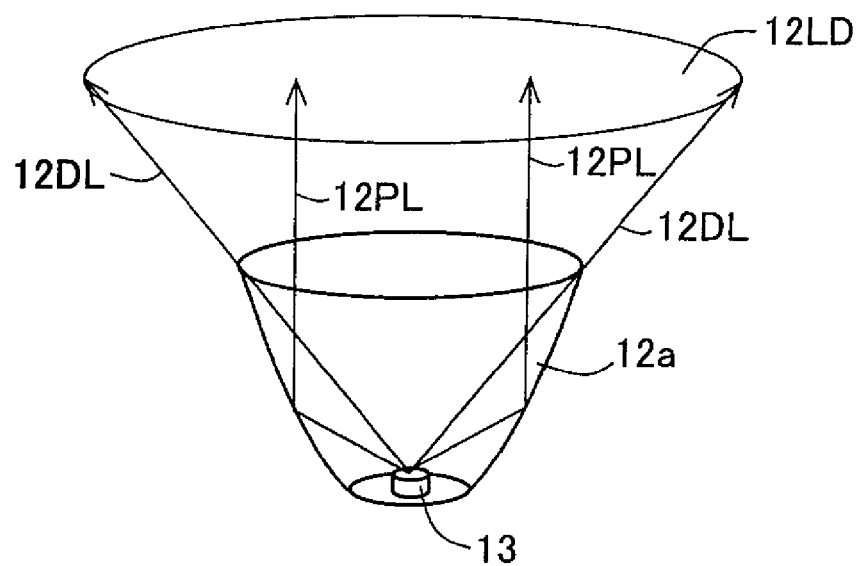

The light source 13 is arranged at a focal point of the first reflection surface 12*a*, which is a paraboloidal surface. As shown in FIG. 7, part of light radiated from the light source 13 is reflected by the first reflection surface 12*a* and propagates as parallel light 12PL. Light 12DL which defines a distribution of light 12LD at the first reflection surface 12*a* is radiated from the light source 13 and exits to an outside of the first reflection surface 12*a* without being reflected by the first reflection surface 12*a*. The distribution of light 12LD means a range of light that is propagating from the first reflection surface 12*a*. The light which defines the distribution of light means light that defines the range, namely, it means light that is reaching an edge of the range. The distribution of light 12LD has a shape of rotational symmetry. The shape of the distribution of light 12LD is circular.

The first reflection surface 12*a* is arranged at a central region of the reflection unit 12. The first reflection surface 12*a* is arranged on the reflection axis 12*ax*. Therefore, in the lighting unit 100*u*, light intensity is higher at the reflection axis 12*ax*.

Figure 8:
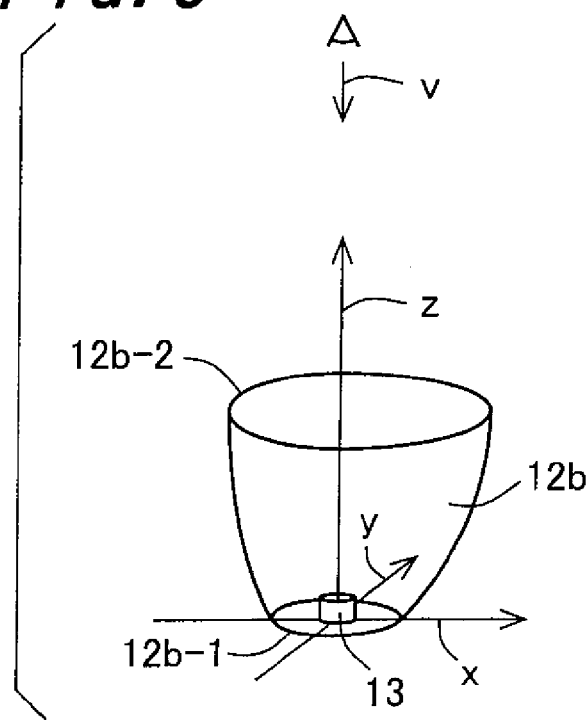
FIG. 8 shows a second reflection surface 12b of the reflection unit 12.
Figure 9:
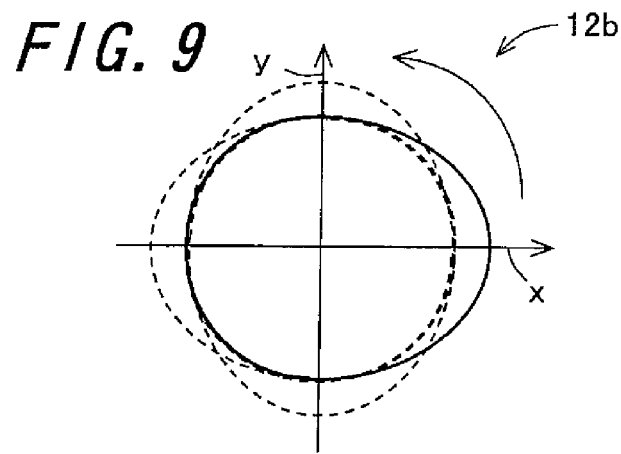
FIG. 9 shows a planar view of the second reflection surface 12b.

As shown in FIGS. 8 and 9, each of the plurality of second reflection surfaces 12*b* has a shape different from that of the first reflection surface 12*a*. As shown in FIG. 9, the second reflection surface 12*b* has a shape of non-rotational symmetry in a planar view. The planar view means a visual field provided by the line of sight indicated with the reference symbol "v" in FIG. 8. The shape of non-rotational symmetry means a shape that causes a mismatch, when the shape is rotated around an origin in an imaginary xy-coordinate, between before and after the rotation.

Figure 10:
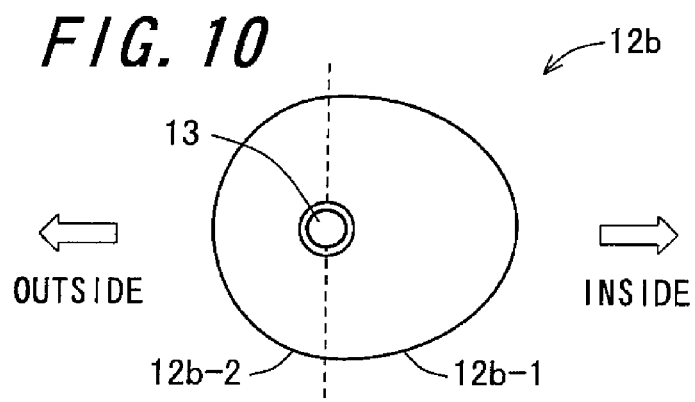
FIG. 10 shows the second reflection surface 12b.

As shown in FIG. 10, the second reflection surface 12*b* has a first portion 12*b*-1 located inside and a second portion 12*b*-2 located outside. The second portion 12*b*-2 has a shape different from that of the first portion 12*b*-1.

The first portion 12*b*-1 reflects the light radiated from the light source 13 in a direction parallel to a propagation direction of the light 12DL defining the distribution of light at the first reflection surface 12*a*. That is, the first portion 12*b*-1 reflects the light radiated from the light source 13 upwardly to above the central region of the lighting unit 100*u*. Therefore, in the lighting unit 100*u*, light intensity is higher around the reflection axis 12*ax*.

The second portion 12*b*-2 reflects the light radiated from the light source 13 in a direction toward the reflection axis 12*ax*. Therefore, in the lighting unit 100*u*, light intensity is higher at the reflection axis 12*ax*.

Figure 11:
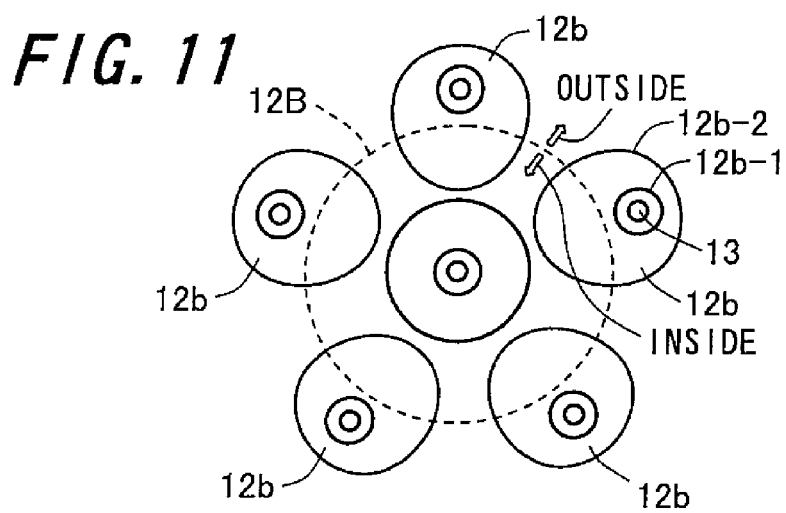
FIG. 11 shows an arrangement of the first reflection surface 12a and the second reflection surface 12b.

As shown in FIG. 11, each of the plurality of second reflection surfaces 12*b* are arranged annularly. The second reflection surface 12*b* has an inside outline 12*b*-1 and an outside outline 12*b*-2. As shown in FIG. 7, the inside outline 12*b*-1 is at a bottom end of the second reflection surface 12*b* in the imaginary xyz-space. The outside outline 12*b*-2 is at a top end of the second reflection surface 12*b* in the imaginary xyz-space.

As shown in FIG. 11, each of the plurality of second reflection surfaces 12*b* is arranged around the first reflection surface 12*a*. The inside outline 12*b*-1 is shifted outwardly within the outside outline 12*b*-2, relative to an arrangement 12B of the plurality of second reflection surfaces 12*b*. Therefore, in the lighting unit 100*u*, light intensity is higher at the reflection axis 12*ax*.

Figure 12:
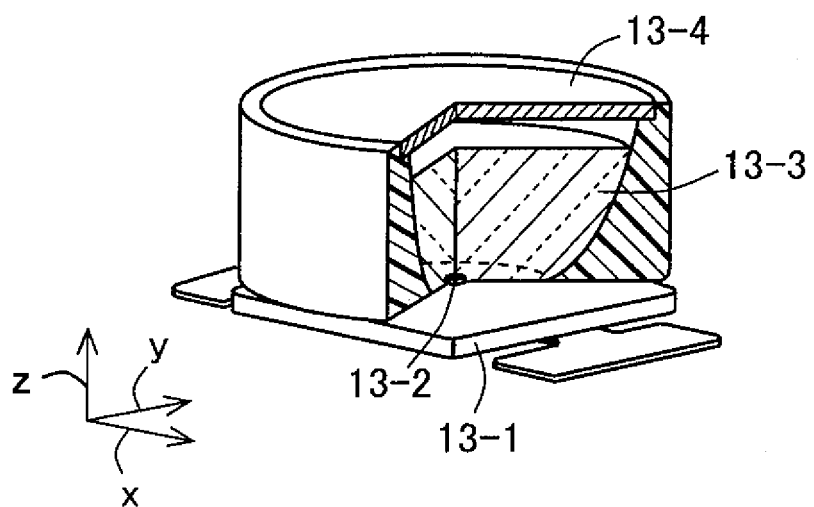
FIG. 12 shows a light source 13.

As shown in FIG. 12, the light source 13 comprises a base 13-1, a light emitting element 13-2 and an encapsulation layer 13-3. The light source 13 further comprises a light emitting member 13-4. The light source 13 is a light emitting diode lamp which emits white light. In FIG. 12, the light source 13 is implemented on the xy-plane in the imaginary xyz-space. The white output light D is emitted upwardly.

The base 13-1 is made of an insulating material. An example of the insulating material is ceramics. Another example of the insulating material is resin. The light emitting element 13-2 is a light emitting diode comprising a plurality of semiconductor layers. The light emitting element 13-2 is implemented on the base 13-1. The light emitting element 13-2 emits primary light making use of driving electric power. The primary light has a wavelength belonging to a blue region or an ultraviolet region.

The encapsulation layer 13-3 is made of a light transmissive material. Light transmissive property of the encapsulation layer 13-3 means that at least part of the primary light radiated from the light emitting element 13-2 passes through the encapsulation layer. An example of the material of the encapsulation layer 13-3 is resin.

The light emitting member 13-4 radiates secondary light in response to the primary light. The secondary light has a wavelength different from that of the primary light. The wavelength of the secondary light is longer than the wavelength of the primary light.

The light emitting member 13-4 includes a matrix material and a fluorescence material. The matrix material has a light transmissive property. The light transmissive property of the matrix material means that at least part of the primary light emitted from the light emitting element 13-2 passes through the matrix material. An example of the matrix material is resin. Light radiated from the fluorescence material passes through the matrix material. The fluorescence material is excited by the primary light.

Figure 13:
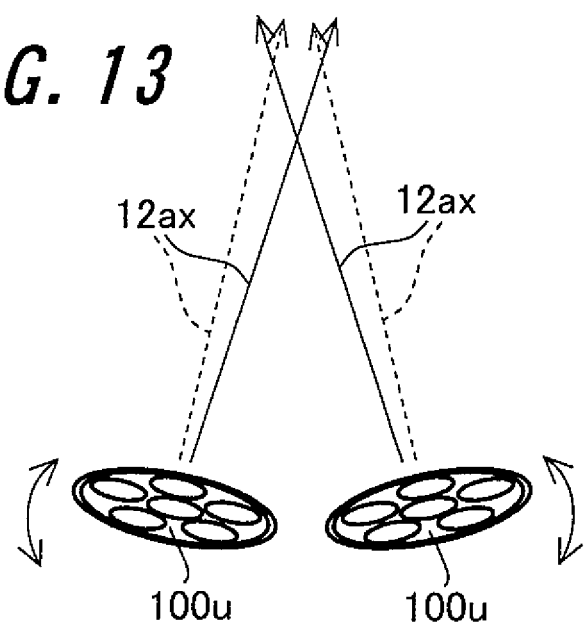
FIG. 13 shows the lighting unit 100u.

As shown in FIG. 13, the plurality of lighting units 100*u* are movable. The plurality of lighting units 100*u* are capable of varying the direction of the reflection axis 12*ax*. Therefore, in the lighting apparatus 100, degree of freedom with respect to an area to be illuminated with light and intensity of illuminating light and the like are increased.

The invention may be embodied in other specific forms without departing from the spirit or essential characteristics thereof. The present embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

The invention claimed is:

1. A lighting apparatus comprising:
a plurality of reflection units each of which includes a first reflection surface and a plurality of second reflection surfaces, each of the plurality of second reflection surfaces being arranged around the first reflection surface and having a shape different from that of the first reflection surface; and
a plurality of light sources each of which includes a light emitting element made of a semiconductor material, the plurality of light sources being arranged within the first reflection surface and the second reflection surfaces,
in each of the plurality of reflection units, each of the plurality of second reflection surfaces being arranged annularly and having an outside outline, and
the light sources within the plurality of second reflection surfaces being arranged so as to be shifted outwardly within the outside outline, relative to an arrangement of the plurality of second reflection surfaces.

2. The lighting apparatus of claim 1, wherein each of the plurality of second reflection surfaces has a shape of non-rotational symmetry.

3. The lighting apparatus of claim 2, wherein the first reflection surface has a shape of rotational symmetry.

4. The lighting apparatus of claim 3, wherein the first reflection surface has a shape of paraboloid.

5. The lighting apparatus of claim 1, wherein each of the plurality of reflection units has a reflection axis defined by the plurality of reflection surfaces.

6. The lighting apparatus of claim 5, wherein each of the plurality of reflection units is capable of varying a direction of the reflection axis.

7. The lighting apparatus of claim 5, wherein the first reflection surface is arranged on the reflection axis.

8. The lighting apparatus of claim 5, wherein the plurality of second reflection surfaces reflect light radiated from the plurality of light sources toward the reflection axis.

9. The lighting apparatus of claim 8, wherein each of the plurality of second reflection surfaces reflects the light in a direction parallel to a propagation direction of light defining a distribution of light at the first reflection surface.

10. A lighting apparatus comprising:
a plurality of reflection units each of which includes a plurality of reflection surfaces defining a reflection axis and is capable of varying a direction of the reflection axis; and
a plurality of light sources each of which includes a light emitting element made of a semiconductor material, the plurality of light sources being arranged within the plurality of reflection surfaces, wherein,
in one reflection unit among the plurality of reflection units, each of the plurality of reflection surfaces is arranged annularly and has an inside outline and an outside outline, and
the inside outline is shifted outwardly within the outside outline, relative to an arrangement of the plurality of reflection surfaces.

11. A lighting apparatus comprising:
a plurality of reflection units each of which includes a plurality of reflection surfaces defining a reflection axis and is capable of varying a direction of the reflection axis; and
a plurality of light sources each of which includes a light emitting element made of a semiconductor material, the plurality of light sources being arranged within the plurality of reflection surfaces, wherein,
in each of the plurality of reflection units, each of the plurality of reflection surfaces is arranged annularly and has an outside outline,
the plurality of light sources are arranged so as to be shifted outwardly within the outside outline, relative to an arrangement of the plurality of reflection surfaces.

12. A lighting unit comprising:
a base;
a plurality of light emitting elements made of a semiconductor material and arranged in a plane on the base;
a first reflection surface surrounding a light emitting element that is located in a central region of the base among the plurality of light emitting elements, and
a plurality of second reflection surfaces each of which has a shape of non-rotational symmetry, and surrounds a light emitting element that is located in a peripheral region of the base among the plurality of light emitting elements,
each of the plurality of second reflection surfaces being arranged annularly and having an inside outline and an outside outline, the inside outline being shifted outwardly within the outside outline, relative to an arrangement of the plurality of second reflection surfaces.

13. The lighting unit according to claim 12, wherein the first reflection surface has a shape of rotational symmetry.

14. The lighting unit according to claim 13, wherein the first reflection surface has a shape of paraboloid.

* * * * *